United States Patent [19]

Chappell et al.

[11] Patent Number: 4,618,784

[45] Date of Patent: Oct. 21, 1986

[54] HIGH-PERFORMANCE, HIGH-DENSITY CMOS DECODER/DRIVER CIRCUIT

[75] Inventors: Barbara A. Chappell, Amawalk; Thekkemadathil V. Rajeevakumar, Scarsdale; Stanley E. Schuster, Granite Springs; Lewis M. Terman, South Salem, all of N.Y.

[73] Assignee: International Business Machines Corporation, Armonk, N.Y.

[21] Appl. No.: 695,664

[22] Filed: Jan. 28, 1985

[51] Int. Cl.$^4$ .................. H03K 19/096; H03K 19/20; H03K 19/017; G11C 8/00
[52] U.S. Cl. ..................................... 307/449; 307/452; 365/230
[58] Field of Search ............... 307/449, 463, 451, 452; 365/230

[56] References Cited

U.S. PATENT DOCUMENTS

| | | | |
|---|---|---|---|
| 4,156,938 | 5/1979 | Proebsting et al. | 365/63 |
| 4,194,130 | 3/1980 | Moench | 307/205 |
| 4,200,917 | 4/1980 | Moench | 365/208 |
| 4,259,731 | 3/1981 | Moench | 307/203 |
| 4,264,828 | 4/1981 | Perlegos et al. | 307/463 |
| 4,301,535 | 11/1981 | McKenny | 307/449 X |
| 4,309,629 | 1/1982 | Kamuro | 307/449 |
| 4,344,005 | 8/1982 | Stewart et al. | 307/463 |
| 4,401,903 | 8/1983 | Iizuka | 307/463 X |
| 4,429,374 | 1/1984 | Tanimura | 365/230 |
| 4,433,257 | 2/1984 | Kinoshita | 307/443 |
| 4,467,225 | 8/1984 | Tanaka | 307/449 X |
| 4,471,240 | 9/1984 | Novosel | 307/449 X |
| 4,477,739 | 10/1984 | Proebsting et al. | 307/449 |
| 4,477,884 | 10/1984 | Iwahashi | 307/449 X |
| 4,514,829 | 4/1985 | Chao | 307/449 X |
| 4,538,247 | 8/1985 | Venkateswaran | 307/449 X |

OTHER PUBLICATIONS

IBM Technical Disclosure Bulletin, vol. 25, No. 4, Sep. 1982, pp. 2135-2136, entitled "CMOS Decoder Circuit", by L. M. Terman.

IBM Technical Disclosure Bulletin, vol. 18, No. 12, May 1976, pp. 3955-3966, entitled "High-Speed FET Decoder", by G. H. Parikh.

Primary Examiner—Larry N. Anagnos
Attorney, Agent, or Firm—John J. Goodwin

[57] ABSTRACT

A decoder/driver circuit for a semiconductor momory having a A1 to AN (true) and A1 to $\overline{AN}$ (complement) address lines for receiving A1 to AN address bit signals thereon from internal address buffers. A ΦPC line is included for receiving a ΦPC precharge clock signal thereon and a ΦR line is provided for receiving a ΦR reset clock signal thereon. The decoder/driver circuit includes a NOR decoder means having a plurality of transistor switching devices connected to A1 to AN−1 or A1 to $\overline{AN-1}$ of the true and complement address lines for the AN to AN−1 address bits for producing a high or low level signal on a decoder output node depending on the address bits state. The decoder/driver circuit further includes a selection means having a plurality of transistor devices connected to the output node of the decoder to produce a first selection signal when the decoder output node and the AN line is high and a second selection signal when the decoder output node and the $\overline{AN}$ line is high. A driver circuit is connected to the selection means and is responsive to the output signal of the NOR decoder circuit and the first selection signal to provide an output signal on a first memory word line and is further responsive to the output signal of the NOR decoder circuit and the second selection signal to provide an output signal on a second memory word line.

11 Claims, 7 Drawing Figures

PRECHARGE ΦPC

ADDRESS A1–AN

WORD LINE (WL)

RESET ΦR

BEGINNING OF CYCLE

HIGH-PERFORMANCE, HIGH-DENSITY CMOS DECODER/DRIVER CIRCUIT

BACKGROUND OF THE INVENTION

1. Field of the Invention

The present invention relates to decoder/driver circuits for semiconductor memories, and more particularly to a circuit that can be used as a word-line decoder/driver or a bit-line decoder driver in a CMOS random access memory.

2. Description of the Prior Art

A variety of decoder circuits for semiconductor memories are available in the art.

In U.S. Pat. No. 4,309,629 issued Jan. 5, 1982 to Kamuro, entitled MOS TRANSISTOR DECODER CIRCUIT, an MOS transistor decoder circuit is disclosed including a plurality of MOS transistors and at least one load element. At least one additional MOS transistor connected to the plurality of MOS transistors and the load element for selecting either of two output terminals for the plurality of MOS transistors, through which decoded output signals are developed. The two additional MOS transistors connected to the two output terminals have normal and complement bit signals, respectively.

In U.S. Pat. No. 4,264,828 issued Apr. 28, 1981 to Perlegos et al, entitled MOS STATIC DECODING CIRCUIT, a metal-oxide-semiconductor static decoding circuit for selecting an addressed line in a high density memory array, or the like, is disclosed. The circuit is laid-out along array lines where the lines have a given pitch. Three levels of decoding are employed. The highest level permits the pulling-up of a common node in the second level decoder. The third level of decoding selects one of a plurality of array lines coupled to this node. Zero threshold voltage MOS devices are employed for coupling the first and third decoders to the second decoder.

In U.S. Pat. No. 4,259,731 issued Mar. 31, 1981 to Moench, entitled QUIET ROW SELECTION CIRCUITRY, there is provided a quiet row select circuit for holding unselected word lines or row select lines in a memory array at a predetermined voltage potential. Transistors are used to couple each row select line to the predetermined voltage potential. The adjacent row select lines of at least one of the adjacent select lines is always coupled to the predetermined voltage when in an unselected state. A transistor is also used to couple each of the adjacent row select lines together and this transistor is enabled whenever the adjacent row select lines are non-selected so that both row select lines are coupled together to the predetermined voltage level.

In another reference of Moench, U.S. Pat. No. 4,200,917 issued Apr. 29, 1980, entitled QUIET COLUMN DECODER, a decoder is provided for semiconductor memory systems which prevents glitches from being coupled into the silicon substrate during the period of time that the sense amplifiers are sensing data on the bit sense lines. The quiet column decoder has double clock NOR gates which allows the address lines to be continuous nonmultiplexed lines. The double clocked NOR gate has two transistors for precharging a first and a second node within the NOR gate. Another transistor is coupled between the second node and a voltage reference terminal to serve as an enabling device for the NOR gate. The first node of the NOR gate serves as an output for the column decoder.

In U.S. Pat. No. 4,429,374 issued Jan. 31, 1984 to Tanimura, entitled MEMORY ARRAY ADDRESSING, an address decoder for one memory axis is disclosed which comprises NAND circuits while the address decoder for the other axis comprises NOR circuits. A semiconductor memory circuit device comprises at least first and second decoder circuits. The first decoder circuit is so constructed as to receive at least partial address signals among address signals of a plurality of bits and to provide decoded signals of the partial address signals as intermediate signals. The second decoder circuit is so constructed as to receive the intermediate signals, to thereby provide signals for selecting from among a plurality of memory circuits a memory circuit determined by the address signals of the plurality of bits.

A publication entitled "CMOS Decoder Circuit" by L. M. Terman, at page 2135 of Vol. 25, No. 4 September 1982 of the IBM Technical Disclosure Bulletin relates to improvements in CMOS decoder circuits, and particularly to a decoder circuit which does not dissipate DC power. The decoder is followed with two branches with CMOS drivers for word lines.

In Vol. 18, No. 12, May 1976 of the IBM Technical Disclosure Bulletin, G. H. Parikh in a publication entitled "High Speed FET Decoder" on page 3955 describes a field-effect transistor decoder circuit which allows improved speed of decoding FET random-access memories, by reducing the capacitance required to be discharged in an unselected decoder.

The speed is further increased by reducing the capacitance of the nodes to be discharged wherein isolation transistor devices are provided to isolate the capacitance on word-line voltage nodes to allow bootstrapping to occur if a node has not been discharged.

Other related prior art includes the following references:

U.S. Pat. No. 4,194,130 to Moench issued Mar. 18, 1980, entitled DIGITAL PREDECODING SYSTEM;

U.S. Pat. No. 4,433,257 to Kinoshita issued Feb. 21, 1984, entitled VOLTAGE SUPPLY FOR OPERATING A PLURALITY OF CHANGING TRANSISTORS IN A MANNER WHICH REDUCES MINORITY CARRIER DISRUPTION OF ADJACENT MEMORY CELLS;

U.S. Pat. No. 4,156,938 to Proebsting et al issued May 29, 1979, entitled MOSFET MEMORY CHIP WITH SINGLE DECODER AND BI-LEVEL INTERCONNECT LINES;

U.S. Pat. No. 4,344,005 to Stewart issued Aug. 10, 1982, entitled POWER GATED DECODING.

SUMMARY OF THE INVENTION

An object of the present invention is to provide a high-performance decoder/driver circuit that can be used as a word-line decoder/driver or a bitline decoder/driver in high performance CMOS RAMs. There are many advantages of the decoder compared to other decoder/driver circuits including the use of a relatively small number of devices.

In addition, other objects of the present invention is to provide decoder/driver circuits for CMOS memories which have a smaller line pitch thereby permitting a denser array.

A further object of the present invention is to provide a memory decoder/driver circuit that exhibits no dc power dissipation.

Still other objects of the present invention are to provide decoder/driver circuits for CMOS memories which demonstrate high performance with no clocking after the address lines have switched, while requiring no long chain of series connected devices, minimizing the stages of delay to select a word line, and minimizing the loading on address lines.

These and other objects, features and advantages of the invention will be more apparent from the following more particular description of the preferred embodiments as illustrated in the accompanying drawings.

DESCRIPTION OF THE PREFERRED EMBODIMENTS

Figure 1:
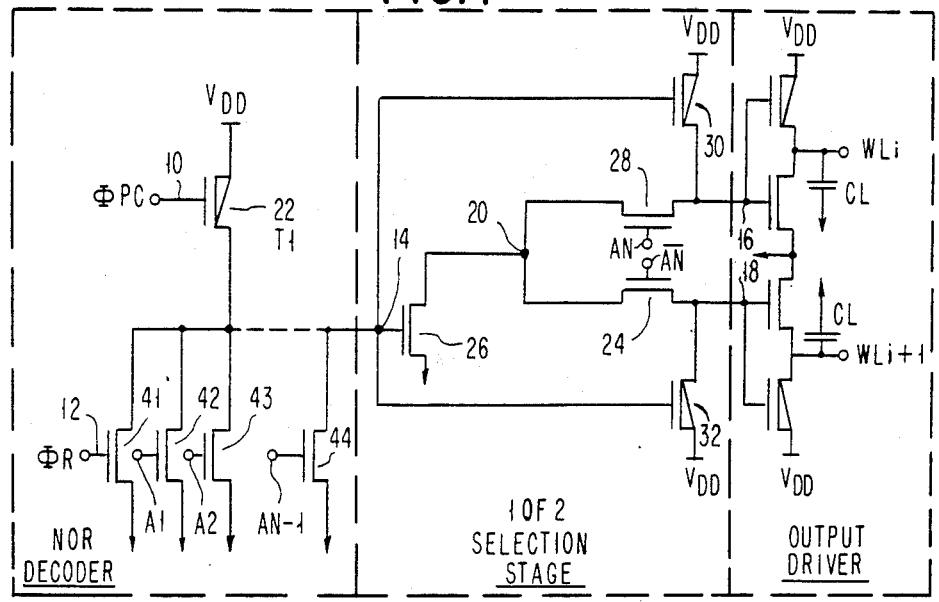
FIG. 1 is a schematic diagram of a decoder/driver circuit according to the principles of the present invention.
Figure 6:
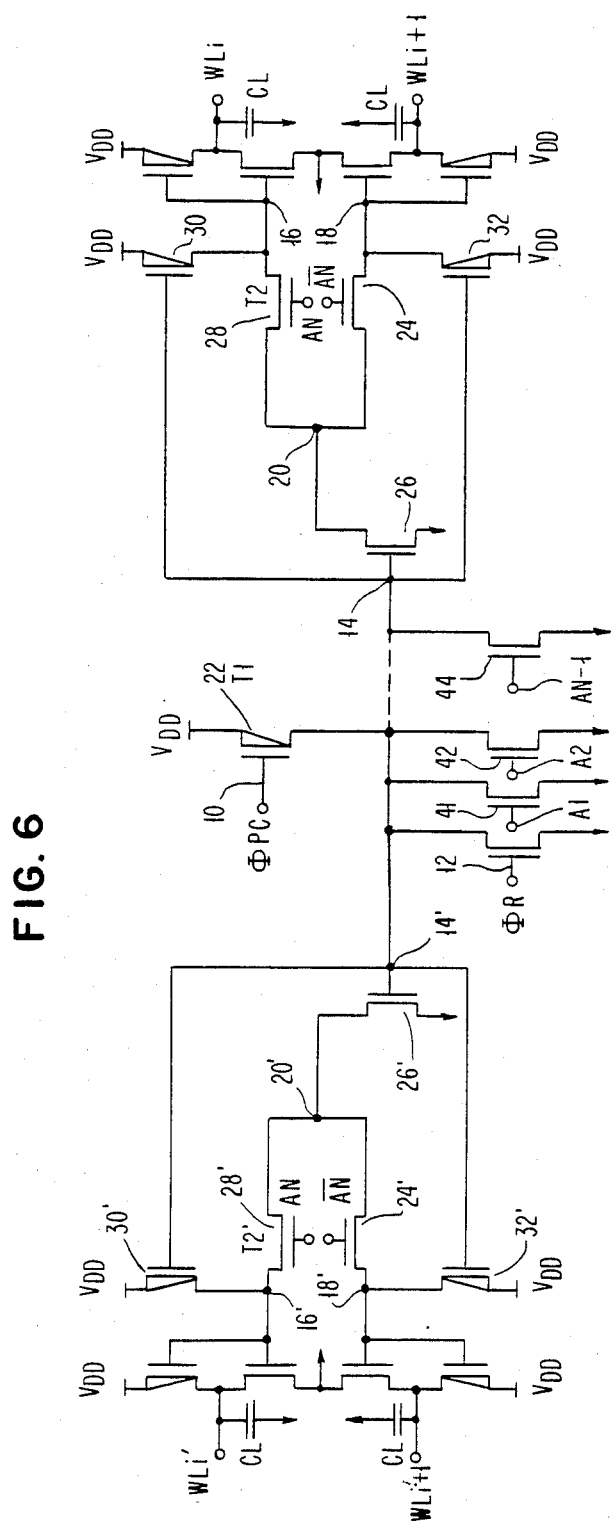
FIG. 6 is a schematic diagram of a circuit including a decoder and two driver outputs.
Figure 7:
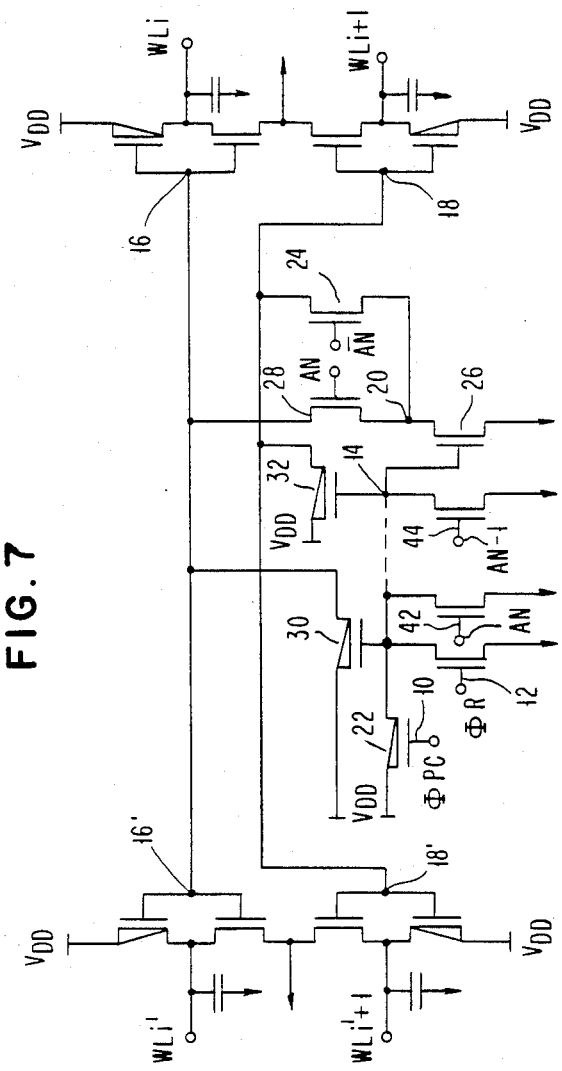
FIG. 7 is a schematic diagram of a circuit which is a modified version of the circuit of FIG. 6 which employs fewer devices.

A schematic diagram of a decoder/driver circuit is shown in FIG. 1. Signal $\Phi PC$ applied on gate lead 10 of p-channel device 22 is a precharge clock signal and signal $\Phi R$ applied on gate lead 12 of n-channel device 41 is a reset clock signal. In FIGS. 1, 6 and 7, a MOSFET device having a diagonal line, as shown in device 22, is a p-channel device whereas a MOSFET without a diagonal line, as shown in device 41, is an n-channel device. Devices 41, 42, 43 . . . 44 are connected in a conventional NOR circuit configuration, well-known to those skilled in the art. Lines A1 through AN are internal address lines from the address buffers, and the first A1-AN−1 are connected to the inputs of the NOR circuit in the conventional manner. That is, the gate of each device in the NOR circuit is connected to either the true or complement address line for the corresponding address bit from the address buffers. The N−1 address bits are connected to $2^{N-1}$ decoders with the circuit drawn in FIG. 1 being an example of just one of such $2^{N-1}$ decoders, each of which is selected (high output) by a different unique address while the remainder of the decoders will remain unselected (low output). The true and complement lines for address bit AN are both connected to the decoder/driver circuit in the 1 of 2 selection stage, and are shown explicitly in FIG. 1. The 1 of 2 selection stage output is the input to the output driver stage.

Figure 2:
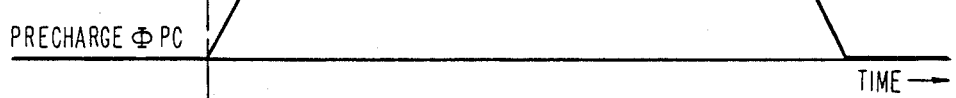
FIGS. 2, 3, 4 and 5 are illustrations of waveforms of signals at various points in the circuit shown in FIG. 1.
Figure 3:
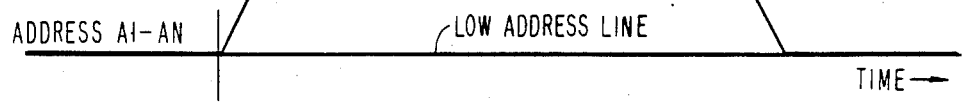
Figure 4:
Figure 5:

The functional operation of the proposed circuit will now be described. At the start of a cycle, the address lines A1, A1, A2, A2 . . . AN, AN are low as shown in FIG. 3. The precharge signal $\Phi PC$ applied to the gate of p-channel device 22 on line 10 is low as shown in FIG. 2 and reset signal $\Phi R$ applied to line 12 is also low as shown in FIG. 5. Node 14 is at $V_{DD}$ and nodes 16 and 18 were charged to $V_{DD}$ when reset clock signal $\Phi R$ on line 12 went high at the end of the previous cycle. At the beginning of the cycle, precharge clock signal $\Phi PC$ goes up (see FIG. 2) turning transistor 22 (T1) off. It is assumed for purposes of explanation that driver output WLi+1 is to be selected. For this case, address lines A1 through AN are low and A1 through AN are high. Since all inputs to the NOR remain low, node 14 remains high, device 26 remains on, and node 20 remains low. Now as soon as signal AN goes high, the node 18 is discharged through transistors 24 and 26. As a result, the driver output WLi+1 is selected and goes high. All other driver outputs including WLi remain low and thus are de-selected. If, on the other hand, signal AN is low and signal AN is high, then node 16 is discharged to ground through transistors 28 and 26, selecting driver output WLi; all other driver outputs remain deselected. If any one of the address inputs A1 through AN−1 goes high, node 14 of the NOR circuit will be discharged, turning off device 26 and preventing the discharge of nodes 16 and 18, keeping both word lines WLi and WLi+1 low or deselected regardless of whether AN or AN goes high. Thus, only one of the $2^{N-1}$ NOR circuits will have a node 14 that is high, allowing a selected word line to rise when either AN or AN goes high.

The decoding function of the circuit is summarized in Table 1, where the state of decoder node 14 will be high in precharge and remains high if the NOR is selected; it goes low if the decoder is deselected. If the NOR is deselected (node 14 low), neither word line WLi or WLi+1 can be selected, while if it is selected (node 14 high) either WLi or WLi+1 will be selected, depending on whether AN or AN goes high. Only one word line WL will be selected for a given address bit pattern.

TABLE 1

| DECODER NODE 14 | AN | AN | WLi | WLi+1 | CONDITION |
|---|---|---|---|---|---|
| High | Low | Low | Low | Low | Precharge |
| High | Low | High | Low | High | Select WLi+1 |
| High | High | Low | High | Low | Select WLi |
| Low | Low | High | Low | Low | Deselected |
| Low | High | Low | Low | Low | Deselected |

Towards the end of the cycle, the clock signal $\Phi R$ goes up and all address line signals A1 through AN as well as A1 through AN go low. The nodes 16 and 18 charge up to $V_{DD}$, pulling the selected driver output low. At the end of the cycle, reset clock signal $\Phi R$ and precharge clock signal $\Phi PC$ go down as shown in FIGS. 2-5. As a result, node 14 is charged to $V_{DD}$, turning off devices 30 and 32, leaving nodes 16 and 18 charged high, but floating. To avoid discharge of the nodes 16 and 18 over a long cycle time, p-channel pull-up devices with gates connected to $\Phi PC$ similar to transistor 22 (T1) can be connected between node 16 and $V_{DD}$ and 18 and $V_{DD}$. Alternatively, the gate of the pull-up device connected to node 16 can be connected to AN, and the gate of the pull-up device connected to node 18 can be connected to AN. In this case, the $\Phi R$ input signal and device 12 may be eliminated.

It is necessary to have the least significant internal address bit signal AN/AN not arrive too early with respect to the other address bit signals A1 through AN−1. If the address bit signal AN/AN arrives too early, it can lead to an erroneous discharge of nodes 16 and 18. For example, if node 14 will discharge when addresses A1 through AN−1 arrive, and if line AN goes high before node 14 has discharged, then node 18 can at least partially discharge erroneously through devices 24 and 26 and this can bring the associated word line WLi+1 up in error. This erroneous signal is transient, and the circuit will eventually settle into the correct output condition. On the other hand, it is desirable to have the address signal AN or AN arrive as early as possible to minimize delay through the entire circuit. Thus, there is a trade off in the early arrival of address bit AN/AN between minimizing the delay through the circuit without causing an erroneous transient discharge. The circuit can be readily optimized for minimum delay without significant erroneous transient without substantial impact on overall performance.

The circuit in FIG. 6 is an alternative embodiment of the invention which selects two driver outputs running in opposite directions for each associated selecting address input. A modified version of FIG. 6 which uses less devices is shown in FIG. 7. A physical layout of the schematic shown in FIG. 7 may be simpler than that of FIG. 6.

The circuit has a number of advantageous features. There is only one NOR circuit per pair of word lines (or per two pairs of word lines as shown in FIGS. 6 and 7). After the address lines switch, no clocking is required before the selected word line rises. This and the low number of delay stages results in high performance. There is no dc power consumed, and dynamic charge storage is required only for a short well-defined portion of the cycle.

It will be appreciated by those skilled in the art that alternative embodiments of the invention may be provided wherein the n type devices may be replaced by p type devices, and vice versa. Also, another inverter may be provided at the output to change the polarity of each output and inverted input signals may be used.

Having thus described our invention, what we claim as new and desire to secure by Letters Patent is:

1. A decoder/driver circuit for a semiconductor memory comprising:

a NOR decoder means connected to true and complement lines of a plurality of A1 to AN−1 memory address bits for receiving said memory address bit signals thereon, said NOR decoder means further including a first output node having a high signal condition thereon when all said plurality of designated address bit signals A1 to AN−1 coupled thereto are at a low signal condition and having a low signal condition thereon when any of said plurality of designated address bit signals A1 to AN−1 have a high signal condition, an output word line driver means coupled to a first memory work line and a second memory work line, a selection means coupled to said first node of said NOR decoder means and the input of said output word line driver means, said selection means being also coupled to the true and complement lines of an AN memory address bit signal, said selection means being responsive to high signal condition on said NOR decoder first node and a high signal condition on said true line of said AN address bit signal for producing a high signal condition on said first memory work line and a low signal condition on said second memory work line, said selection means being also responsive to a high signal condition on said NOR decoder first node and a high signal condition on said complement line of said AN address bit signal for producing a high signal condition on said second memory work line and a low signal condition on said first memory work line, wherein said selection means includes a first transistor switching device having a gate coupled to said true line of said AN address bit signal and a second transistor switching device having a gate coupled to said complement line of said AN address bit signal, a third transistor switching device having a gate coupled to said first node of said NOR decoder means, said third transistor switching device being coupled to and forming a conduction path between first and second transistors and voltage ground when said third transistor is switched on in response to a high signal condition on said NOR decode first node, wherein a high signal condition on said true line coupled to said first transistor and a high signal condition on said NOR decoder first node coupled to said third transistor forms a conduction path for producing said high signal condition on said first word line, and wherein a high signal condition on said complement line connected to said second transistor and a high signal condition on said NOR decoder first node forms a conduction path for producting said high signal condition on said second word line.

2. A decoder/driver circuit according to claim 1 wherein said NOR decoder means includes a plurality of switching transistors coupled to said true and complement lines of said plurality of A1 to AN−1 memory address bits and wherein a high signal condition on any of the lines connected to said NOR decoder produces a discharge of said NOR decoder first node and switches off said third transistor of said selection means, resulting in said first and second word lines remaining low.

3. A decoder/driver circuit according to claim 2 wherein said NOR decoder means further includes a precharge transistor device coupled between a potential voltage supply source and said NOR decoder first node, and which switches off in response to a precharge clock signal ΦPL applied to the gate thereof.

4. A decoder/driver circuit according to claim 3 wherein said NOR decoder means further includes a reset transistor device coupled to said decoder first node and responsive to a reset signal ΦR applied to the gate thereof for discharging said NOR decoder first node.

5. A decoder/driver according to claim 4 wherein said first switching transistor device coupled to said third switching transistor device and responsive to said AN address bit signal, is further coupled to said voltage supply source via a second node, and said second switching transistor device coupled to said third switching transistor device and responsive to said AN address bit signal is further coupled to said voltage supply source via a third node, wherein said first memory word line is coupled to said second node and said second memory word line is coupled to said third node, and wherein said first transistor device swithces in response to said AN bit address signal and discharges said second node through said first switching transistor device and said third switching transistor device thereby providing an output signal on said first memory word line.

6. A decoder/driver circuit according to claim 5 wherein said second transistor device switches in response to said AN address bit signal and discharges said third node through said second switching transistor device and said third switching transistor device thereby providing an output signal on said second memory word line.

7. A decoder/driver circuit according to claim 6 wherein initially said ΦPC signal and said ΦR signal are at a low voltage state, said NOR decoder first node is at a high voltage state, said second and third nodes are at a high voltage state, said true and complement address lines are at a low voltage state and said first and second memory word lines are at a low voltage state, and wherein said ΦPC signal goes to a higher voltage state, said precharge transistor device switches off, said address lines of said NOR decoder remain at a low state, said NOR decoder first node remains at a high voltage state, and said second node discharges through said first and third transistor devices in response to said AN address bit signal applied to said first transistor device, thereby raising the voltage on said first memory word line to a higher voltage state.

8. A decoder/driver circuit according to claim 7 wherein said ΦR signal goes to a higher voltage state after voltage on said memory word line goes to a higher state, said address lines go to a lower voltage state, and said second and third nodes charge up to a higher voltage state thereby returning said memory word line signal to a lower voltage state.

9. A decoder/driver circuit according to claim 8 wherein said ΦR and said ΦPC signals return to lower voltage states, thereby charging said NOR decoder first node to a higher voltage state.

10. A decoder/driver circuit according to claim 6 wherein initially said ΦPC signal and said ΦR signal are at a low voltage state, said NOR decoder first node is at a high voltage state, said second and third nodes are at a high voltage state, said true and complement address lines are at a low voltage state and said first and second memory word lines are at a low voltage state, and wherein said ΦPC signal goes to a higher voltage state, said precharge transistor device switches off, said address lines of said NOR decoder remain at a low state, said NOR decoder first node remains at a high voltage state, and said third node discharges through said second and third transistor devices in response to said AN address bit signal applied to said second transistor device, thereby raising the voltage on said second memory word line to a higher voltage state.

11. A decoder/driver circuit according to claim 2 further including a second selection means and a second output word line driver means coupled to said NOR decoder means at said NOR decoder first node.

* * * * *